(12) United States Patent
Paumier (10) Patent No.: US 9,543,917 B2
(45) Date of Patent: Jan. 10, 2017

(54) SOFTWARE FOR MANIPULATING EQUALIZATION CURVES

(71) Applicant: Fabrice Gabriel Paumier, Los Angeles, CA (US)

(72) Inventor: Fabrice Gabriel Paumier, Los Angeles, CA (US)

( * ) Notice: Subject to any disclaimer, the term of this patent is extended or adjusted under 35 U.S.C. 154(b) by 0 days.

(21) Appl. No.: 14/605,986

(22) Filed: Jan. 26, 2015

(65) Prior Publication Data

US 2015/0215703 A1    Jul. 30, 2015

Related U.S. Application Data

(60) Provisional application No. 61/931,513, filed on Jan. 24, 2014.

(51) Int. Cl.
| | | |
|---|---|---|
| *H04R 3/04* | (2006.01) |
| *H03G 3/00* | (2006.01) |
| *H03G 5/00* | (2006.01) |
| *H03G 5/16* | (2006.01) |

(52) U.S. Cl.
CPC ............ *H03G 3/00* (2013.01); *H03G 5/005* (2013.01); *H03G 5/165* (2013.01)

(58) Field of Classification Search
CPC .......... H04R 3/04; H04R 2430/00; H03G 3/00
USPC ..... 84/615; 345/593, 440; 381/103, 119, 56; 708/300; 715/727; 725/151; 370/230; 455/161.1; 700/94; 704/200.1
See application file for complete search history.

(56) References Cited

U.S. PATENT DOCUMENTS

| | | | | |
|---|---|---|---|---|
| 6,405,227 B1 * | 6/2002 | Prakash | ................ | H03H 17/02 708/300 |
| 7,286,473 B1 * | 10/2007 | Gorman | ............. | H04L 12/5693 370/230 |
| 7,518,055 B2 * | 4/2009 | Zartarian | ............... | H04H 60/04 84/615 |
| 7,532,731 B2 * | 5/2009 | Aiso | ..................... | H04H 60/04 369/4 |
| 7,647,221 B2 * | 1/2010 | Michener | ........... | G10L 21/0364 704/200.1 |
| 7,912,226 B1 * | 3/2011 | James | .................. | H03G 3/3089 340/500 |
| 7,933,422 B2 * | 4/2011 | Okabayashi | .......... | H04H 60/04 369/3 |
| 8,098,850 B2 * | 1/2012 | Terada | ..................... | H04S 7/00 381/119 |
| 8,356,250 B2 * | 1/2013 | Ko | ...................... | H04M 1/6016 381/104 |
| 8,477,965 B2 * | 7/2013 | Radford | ................. | H04H 60/04 381/118 |
| 8,478,217 B2 * | 7/2013 | Aikenhead | ............ | H04B 1/086 455/161.1 |
| 8,849,434 B1 * | 9/2014 | Pontual | .............. | H04N 21/4394 700/94 |
| 9,154,100 B2 * | 10/2015 | Mate | ..................... | H03G 5/005 |

(Continued)

*Primary Examiner* — Gerald Gauthier
(74) *Attorney, Agent, or Firm* — Buche & Associates, P.C.; John K. Buche; Bryce A. Johnson (57) ABSTRACT

The disclosed embodiment may be a parametric equalization hardware that is coupled to computer readable memory software configured to present a command interface to a user and control the equalization hardware to manipulate the frequency, Q, and gain. Additionally, software is configured to simultaneously vary the Q and gain of an equalization curve between two preset values defined by: (1) a high gain and narrow Q ("Fire"); and (2) low gain and wide Q ("Water").

2 Claims, 10 Drawing Sheets

(56) References Cited

U.S. PATENT DOCUMENTS

| | | | | |
|---|---|---|---|---|
| 2004/0146170 A1* | 7/2004 | Zint | .......... | H03G 5/04 |
| | | | | 381/103 |
| 2004/0164983 A1* | 8/2004 | Khozai | ............ | G06T 11/206 |
| | | | | 345/440 |
| 2004/0199933 A1* | 10/2004 | Ficco | ............ | H04N 5/602 |
| | | | | 725/151 |
| 2011/0153045 A1* | 6/2011 | Ryckman | ............ | G10H 1/361 |
| | | | | 700/94 |
| 2013/0222412 A1* | 8/2013 | Pertierra | ............ | G09G 5/02 |
| | | | | 345/593 |
| 2015/0215703 A1* | 7/2015 | Paumier | ............ | H03G 3/00 |
| | | | | 381/103 |

* cited by examiner

SOFTWARE FOR MANIPULATING EQUALIZATION CURVES

CROSS-REFERENCE TO RELATED APPLICATIONS

This application claims the benefit of U.S. Provisional Patent Application No. 61/931,513 filed on Jan. 24, 2014. The previous application is hereby incorporated by reference in its entirety.

STATEMENT REGARDING FEDERALLY SPONSORED RESEARCH OR DEVELOPMENT

Not applicable.

BACKGROUND OF THE INVENTION

Field of Invention

The present disclosure pertains to audio equalization.

Background of the Invention

An audio signal is a representation of sound as an electrical voltage waveform. Audio signals which correspond to audible sounds have frequencies between approximately 20 and 20,000 Hz. Audio signals may be characterized by parameters, like, for instance: bandwidth, power level, and voltage level. In many situations, a signal needs to be processed in order to modify its character and, correspondingly, the sound underlying the signal.

Equalization is one process by which the character of an audio signal can be changed. Bell or peak filters are widely used in equalization. Equalizers are the circuits or equipment used to achieve equalization.

In equalization, an audio signal's character is changed by varying the center frequency, the Q-factor (or bandwidth), and gain (decibel) of the frequency response curve of an audio system. Known parametric equalizers are configured to manipulate these three variables independently. The change in character of an audio signal can be quantitatively represented by a frequency response bell curve, which represents differences between input signals and output signals as a plot of amplitude versus frequency. In the bell curve, the gain is the height of the curve, the frequency is the center of the peak, and the Q-factor is the width of the curve.

A peak filter is a resonant filter, meaning that the frequencies that are affected by the filter will "resonate." It translates into the time domain by producing an oscillating, or resonant, impulse response, which characteristics depends on the parameters of the peak filter.

One of the problems of audio equalization is the management of resonances, which can occur at the center frequency of a bell shaped equalization filter. A resonance in equalization can be described as an amplitude peak of the equalization curve. Generally, a resonance can relate to the amplitude of the sound being louder at a specific frequency (resonant frequency) than the rest of the audio in the same sound.

A standard peak filter has a resonance which is defined primarily by the gain and the Q-factor. The steeper (the higher the Q-Factor) the peak filter is, then the more resonant the filter is. A steeper filter exhibits a longer impulse response. A wider filter exhibits a shorter impulse response, but with a higher amplitude, and can be described as less resonant. So the more resonant the filter, the longer the impulse response.

Independent manipulation of the variables (frequency, gain, and Q-factor) results in limited equalization ability. For instance, manipulating the gain fixes the relationship between frequency and amplitude of the frequency response curve. This means that equalization has been limited to adjustments in the scaling of a fixed frequency response curve. In view of the foregoing, a need exists for equalization of an audio signal that does not result in scaled frequency response curves.

SUMMARY OF THE INVENTION

An objective of this disclosure is to propose an additional parameter for adjusting the bell-shaped curves in parametric equalization. This new parameter, "Character" is continuous and allows for a user to adjust the shape of the equalization curve in real time. "Character" has three main modes: "Neutral;" "Fire;" and "Water."

It is another object of the invention to propose three new basic curve shapes which can be used for equalization.

It is a further object of the invention to control the relationship between the frequency and the amplitude in a specific way, which has been designed to fulfill the needs and constraints of equalization and mastering engineers. It is a further object of the invention to create an equalization method that manages resonance while still allowing the sound to remain natural.

It is a further object of the present invention to solve problems related to resonances when equalizing and control resonances with an additional parameter.

It is a further object of the present invention to adjust the resonance of the filter independently of the loudness added or removed by the filter.

In one embodiment, the disclosed subject matter is improved software for manipulating equalization curves via a parametric equalizer. Equalization curves are generally defined by three parameters, namely: frequency (in Hz); quality factor ("Q"); and, gain (in dB). The disclosed embodiment may be a parametric equalization hardware that is coupled to computer readable memory software configured to present a command interface to a user and control the equalization hardware to manipulate the frequency, Q, and gain, and software configured to simultaneously vary the Q and gain of an equalization curve between two preset values defined by: (1) a high gain and narrow Q ("Fire"); and (2) low gain and wide Q ("Water").

BRIEF DESCRIPTION OF THE FIGURES

Other objectives of the disclosure will become apparent to those skilled in the art once the invention has been shown and described. The manner in which these objectives and other desirable characteristics can be obtained is explained in the following description and attached figures in which.

It is to be noted, however, that the appended figures illustrate only typical embodiments of the disclosed assemblies, and therefore, are not to be considered limiting of their scope, for the disclosed assemblies may admit to other equally effective embodiments that will be appreciated by those reasonably skilled in the relevant arts. Also, figures are not necessarily made to scale.

DETAILED DESCRIPTION OF PREFERRED EMBODIMENTS

In general, the disclosed subject matter is improved software for manipulating equalization curves via a parametric equalizer. In one embodiment, the disclosed subject matter is parametric equalization hardware that may be coupled to computer readable memory software configured to present a command interface to a user and control the equalization hardware to manipulate the frequency, the Q, and the gain of an audio signal. Additionally, software is configured to simultaneously vary the Q and gain of an equalization curve between two preset values defined by: (1) a high gain and narrow Q ("Fire"); and (2) low gain and wide Q ("Water").

In one embodiment, the disclosed technology features audio equipment hardware, including an equalizer and computer hardware coupled to computer readable memory. Suitably, software may be installed on the computer readable memory for equalizing an audio signal. Suitably, the computer hardware and software are configured to visually present the frequency response curve of the audio equipment to the user. Additionally, the computer software may be operationally configured to alter the shape of the resonance response curve and correspondingly equalize the audio signal. In one embodiment, the frequency response is presented as a normal bell curve. The standard or normal frequency response curve is also called the "Neutral" Curve. Suitably, the software is configured with a new parameter for adjusting the shape of the neutral curve. This parameter is called "Character Control". Finally, the software is configured for adjusting the curves via manipulating the frequency for translating the curve, Q for manipulating the horizontal scale of the curve, and gain for adjusting the vertical scale of the curve.

Figure 1:
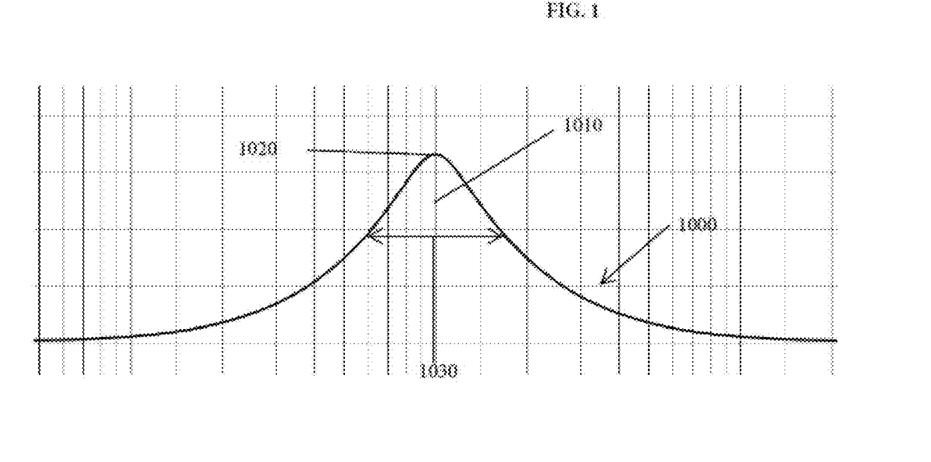
FIG. 1 shows a basic equalization bell curve used in parametric equalizers.

FIG. 1 shows a basic or standard equalization bell curve 1000 used in parametric equalizers. The x axis shows frequency in hertz and the y axis shows response in decibels. The characteristics of the curve are the frequency 1010, or the center of the peak; the gain 1020, or the height of the peak; and the Q-factor 1030, or the width of the peak.

Figure 2:
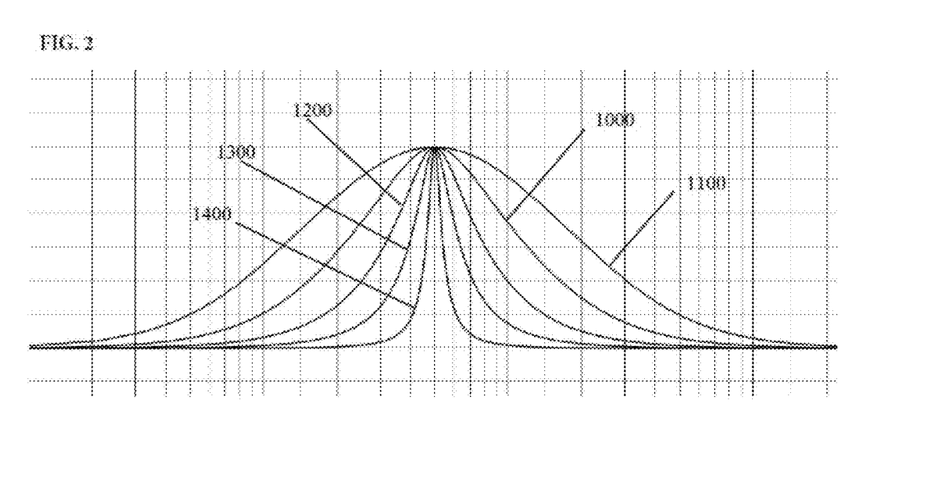
FIG. 2 shows a series basic bell curves with the same frequency and gain, but different Q-factors.

FIG. 2 shows a series of bell curves. Once again, x axis shows frequency in hertz and the y axis shows response in decibels. The individual bell curves 1000, 1100, 1200, 1300, 1400 have the same frequency and gain, but a different Q-factor. The curve 1000 is the standard bell curve shown in FIG. 1. As shown, the Q-factor affects the width of the curves. Curve 1400 is the narrowest of the curves and curve 1100 is the widest.

Figure 3:
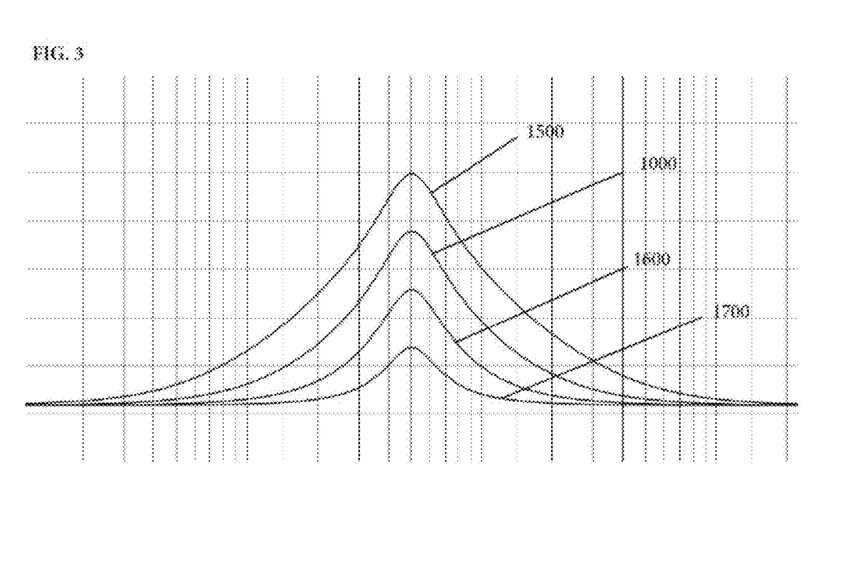
FIG. 3 shows a series of bell curves with the same frequency and Q-factors, but different gains.

FIG. 3 shows a series of bell curves. Like FIGS. 1 and 2, the x axis shows frequency in hertz and the y axis shows response in decibels. The individual bell curves 1000, 1500, 1600, 1700 have the same frequency and Q-factor, but a different gain. The curve 1000 is the standard bell curve shown in FIGS. 1 and 2. The gain corresponds to volume as measured in decibels. As shown, the gain affects the height of the curves. Curve 1700 is the smallest (lowest decibel) of the curves and curve 1500 is the tallest (highest decibel).

The standard curve 1000 shown in FIGS. 1-3 can ordinarily be modified by altering the frequency, gain and/or Q-Factors. This disclosure introduces a fourth parameter to adjust the characteristics of the curve 1000 called "Character." The "Character" parameter may suitably allow for continuous adjustments to the shape of the equalization curve 1000 in real time. "Character" preferably has three main modes: the "Neutral" mode which sets the equalization curve to the standard bell shaped filter 1000; "Water" which is a less resonant, smoother curve; and "Fire," which is a more focused curve.

Figure 4:
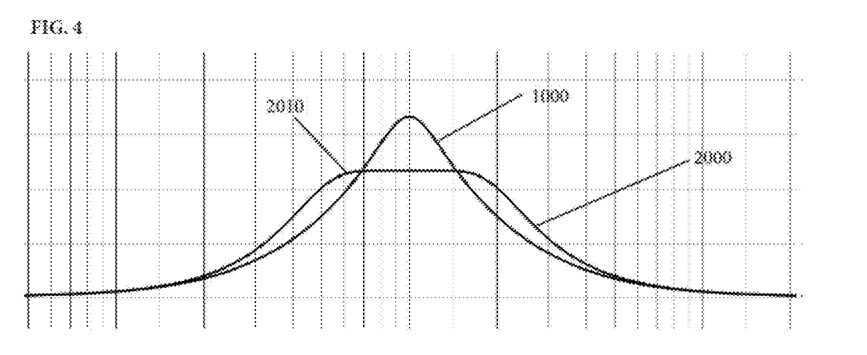
FIG. 4 shows the standard basic bell curve of FIG. 1 plotted against the "Water" filter.

The "Water" curve 2000 is shown in FIG. 4, which depicts the standard bell curve 1000 and a curve 2000 that has been manipulated by the "Water" filter. The shape of the "Water" curve 2000 matches the sides of the standard bell curve 1000, but the center 2010 is flat. The energy of the "Water" curve 2000 is approximately equivalent to the peak of the standard bell curve 1000, but is more evenly distributed around the center frequency 1010 of the curve 2000. The "Water" curve 2000 may be useful when focused modifications of the spectrum of a signal and short time response, or low resonance, are needed. The "Water" curve 2000 may also be useful when a broader range of frequency equalization is needed to avoid parts of the equalized spectrum around the center frequency that are too loud. In one embodiment, the "Water" curve 2000 is ideal for audio that is open and natural sounding.

Figure 5:
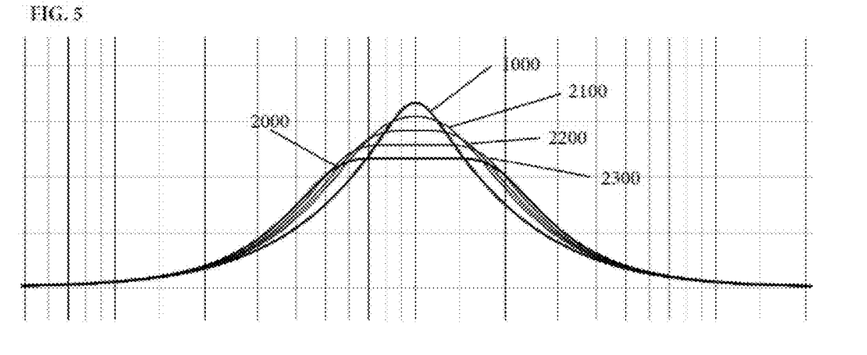
FIG. 5 shows the transition between the basic bell curve and the "Water" filter.

To achieve a shorter response time, the shape of the standard bell curve 1000 may be modified by flattening the top of the curve, while keeping the sides as close as possible to the sides of the standard bell curve 1000 with the same frequency, gain, and Q-factor. This process is illustrated in FIG. 5. The result is a filter which is less resonant than the standard bell curve 1000. FIG. 5 shows the transition between the standard bell curve 1000 and the "Water" curve 2000. Three intermediate curves 2100, 220, 2300 are shown. The peak 1010 of the standard bell curve 1000 gradually flattens out while the sides far from the center of the curve 1000 are largely unaffected. Preferably, the transition between the standard curve and the "water curve" may be continuous.

Figure 6:
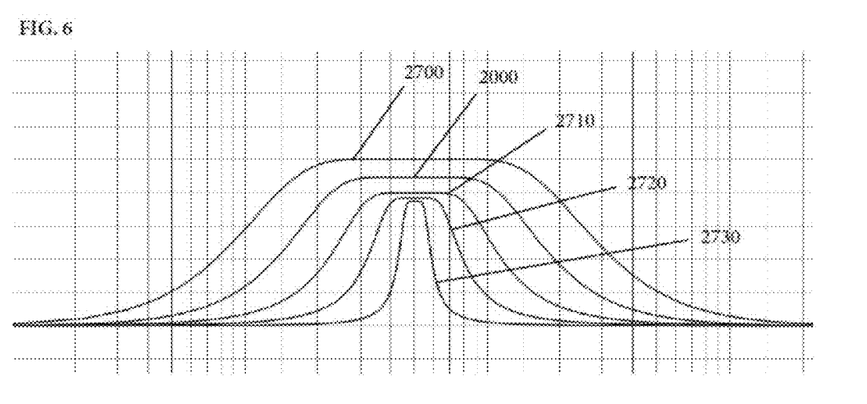
FIG. 6 depicts various "Water" filters with varying Q-factor settings.
Figure 7:
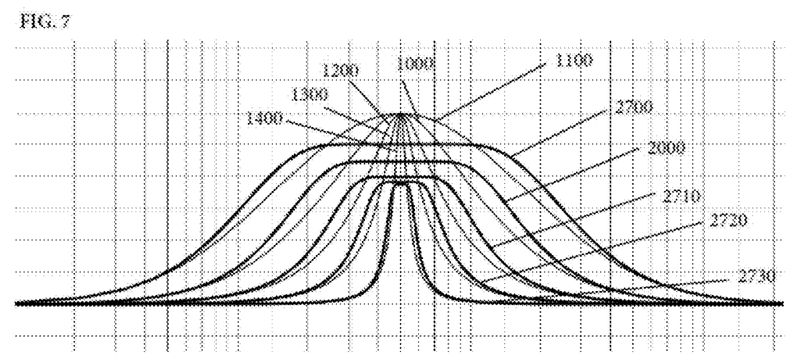
FIG. 7 depicts the various "Water" filters of FIG. 6 plotted with the bell curves of FIG. 2.

FIG. 6 depicts various "Water" curves 2000, 2700, 2710, 2720, 2730 at various Q-factor settings with fixed gain and frequency settings. FIG. 7 depicts the same "Water" curves 2000, 2700, 2710, 2720, 2730 of FIG. 6 against the series of bell curves 1000, 1100, 1200, 1300, 1400 of FIG. 2.

Figure 8:
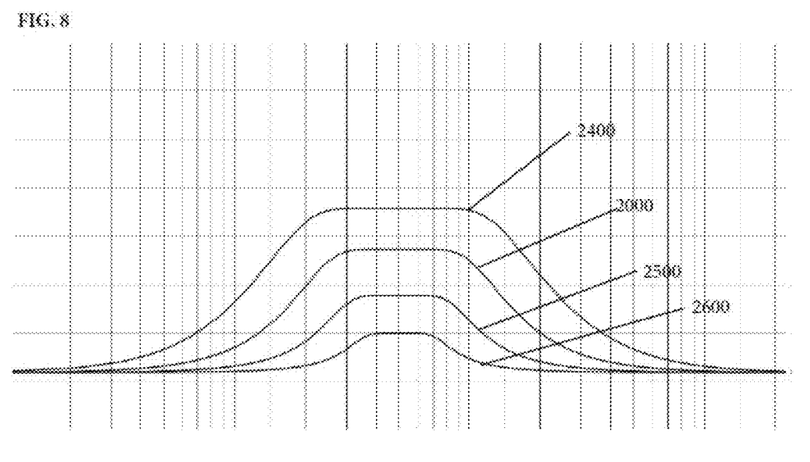
FIG. 8 depicts various "Water" filters with fixed frequency and Q-factors, but varied gains.
Figure 9:
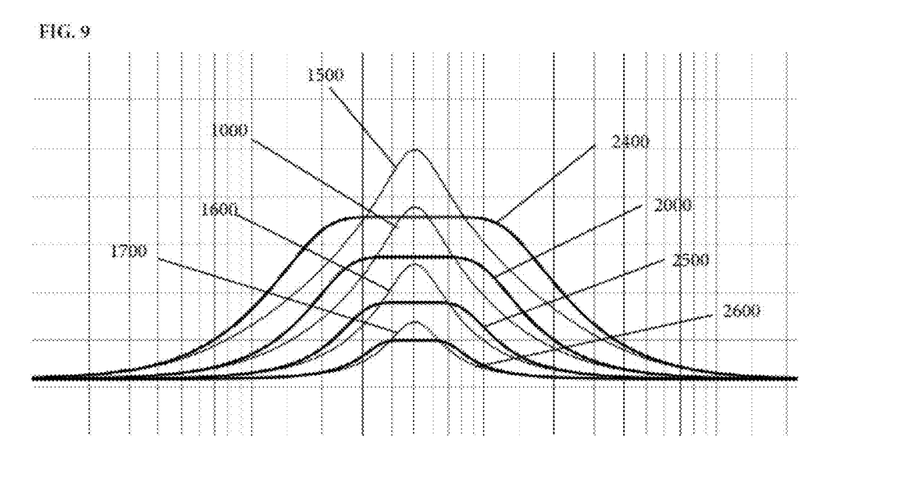
FIG. 9 depicts the "Water" filters of FIG. 8 plotted against the curves of FIG. 3.

FIG. 8 shows various "Water" curves 2000, 2400, 2500, 2600 with fixed frequency and Q-factors, but varied gains. FIG. 9 shows the various "Water" curves 2000, 2400, 2500, 2600 imposed on the standard curves 1000, 1500, 1600, 1700 of FIG. 3.

Figure 10:
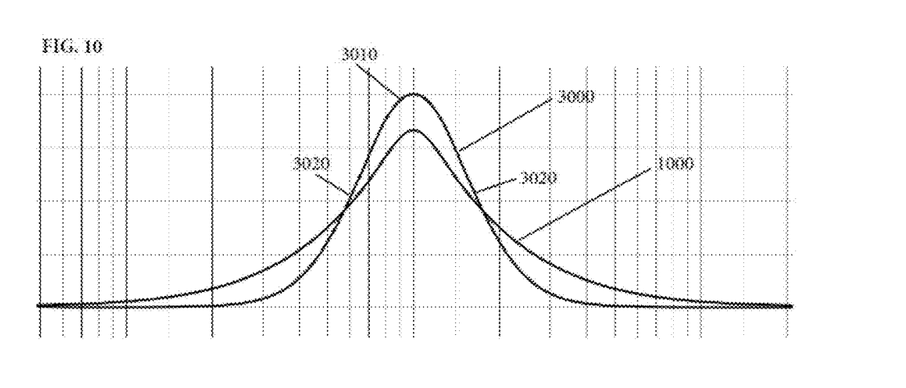
FIG. 10 depicts the standard bell curve of FIG. 1 plotted against a "Fire" filter.

In addition to the "Water" mode, the "Character" can also be set to "Fire" mode. FIG. 10 depicts a curve 3000 after the "Fire" filter has been applied and plotted with a standard bell curve 1000. The top 3010 of the "Fire" curve 3000 is smoother than the standard bell curve 1000. The sides 3020 of the "Fire" curve 3000 are more focused than the standard bell curve 1000, but the energies of the two curves 1000, 3000 are approximately the same.

Figure 11:
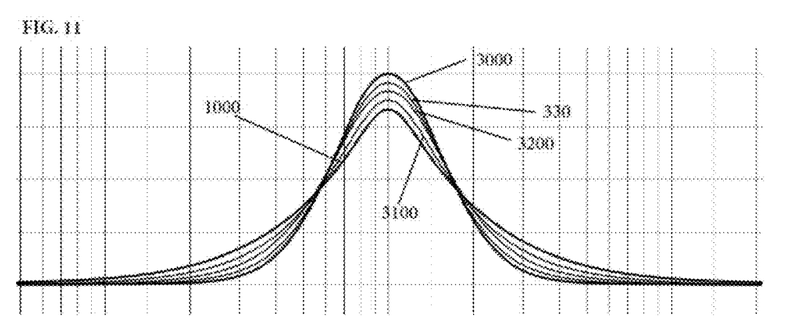
FIG. 11 depicts the transition between the standard bell curve and the "Fire" filter.

The transition from the standard bell curve 1000 to the "Fire" curve 3000 can be seen in FIG. 11. FIG. 11 shows the standard curve 1000, the "Fire" filter 3000 and three intermediates 3100, 3200, 3300. The center 1010 of the standard bell curve 1000 remains as smooth as the filter transitions to the "Fire" curve 3000, while the sides 3020 of the filter become narrower. Preferably, this transition between the curves is continuous. To achieve a more focused frequency response, while keeping the same resonance, the shape of the standard bell curve 1000 is modified. The result is a filter with a more focused range of frequencies than the standard bell curve 1000, but with an equivalent time response length.

The "Fire" mode preferably provides equalization curves which can be defined as a more focused frequency response. The "Fire" filter can be used when a steeper, more focused modification to the signal is needed, but the response time is required to remain the same length as a standard bell curve 1000. The "Fire" curve 3000 is suitably characterized by a taller gain and a narrower Q-factor than the standard bell curve 1000. It has more energy in the center and less energy at the sides. The Fire curve 3000 may be ideal for focused audio with boosts and cuts while maintaining a tight phase-response. The "Fire" filter can also be used when a broader range of frequency equalization is needed to avoid the sides of the standard bell curve 1000 from being modified too much. Also, the energy of the "Fire" curve 3000 is adjusted to be approximately the same for the standard bell curve 1000. This will keep the auditory sensation the same when processing audio signals.

Figure 12:
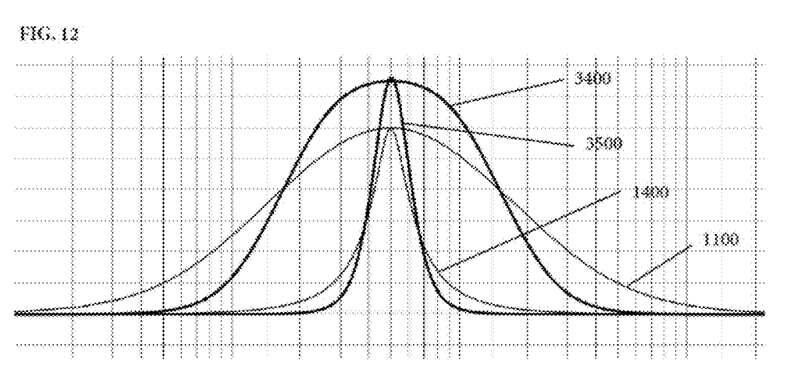
FIG. 12 shows two of the standard curves from FIG. 2 and the same curves in "Fire" mode.

FIG. 12 shows two of the standard curves 1300, 1400 from FIG. 2, and the same curves 3400, 3500 in "Fire" mode. The "Fire" curves 3400, 3500 have higher gains toward the center, and lower gains on the sides.

Figure 13:
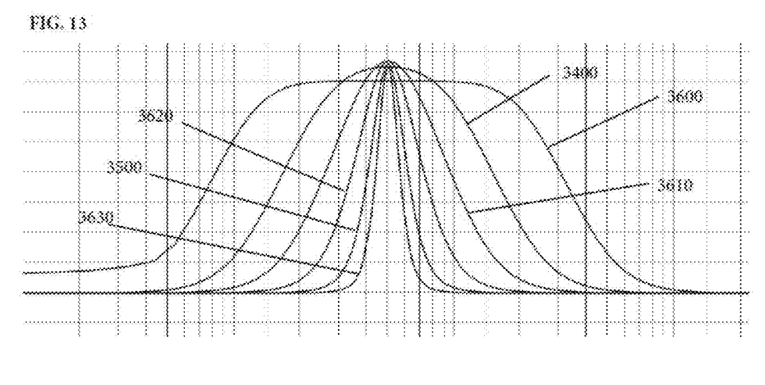
FIG. 13 depicts the "Fire" curves of FIG. 12 and several other "Fire" curves with different Q-factors.

FIG. 13 depicts the "Fire" curves 3400, 3500 of FIG. 12 and several other Fire curves 3600, 3610, 3620, 3630 with different Q-factors settings.

Figure 14:
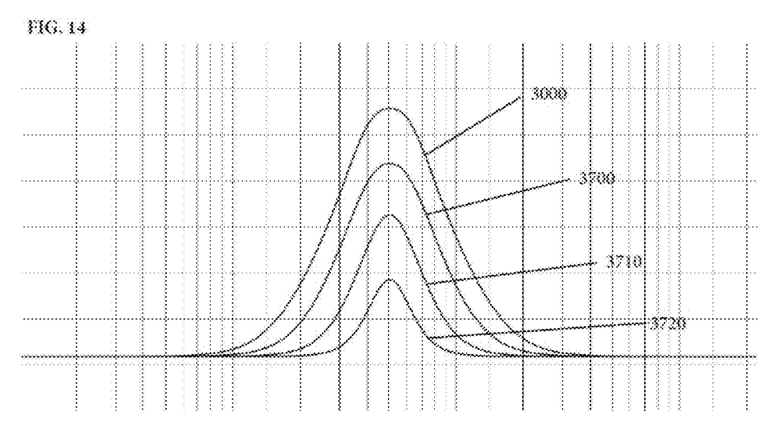
FIG. 14 depicts different "Fire" curves with fixed frequency and Q-factors, but different gains.
Figure 15:
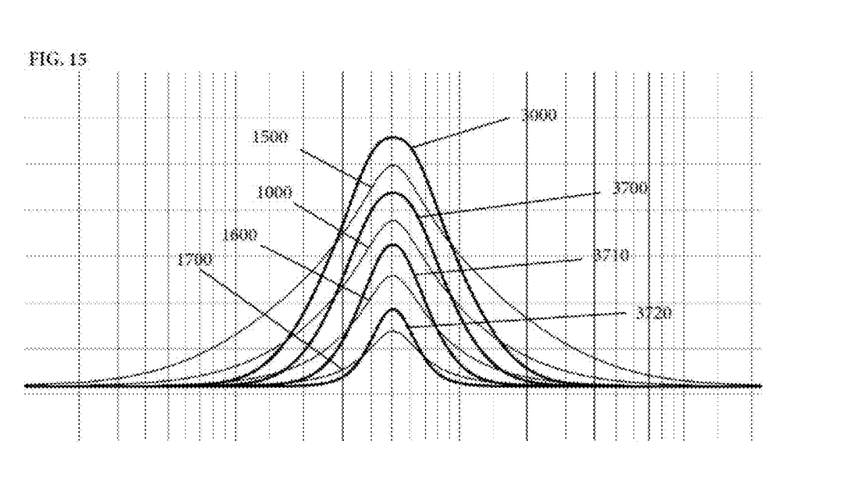
FIG. 15 depicts the curves of FIG. 14 plotted against the curves of FIG. 3.

FIG. 14 depicts "Fire" curves 3000, 3700, 3710, 3720 with fixed frequency and Q-factors, but different gains. FIG. 15 shows the curves 3000, 3700, 3710, 3720 of FIG. 14 plotted against the curves 1000, 1500, 1600, 1700 of FIG. 3. As shown, the peaks of the Fire curves 3000, 3700, 3710, 3720 become smoother as the gain increases and the sides become narrower compared with the standard curves 1000, 1500, 1600, 1700.

Figure 16:
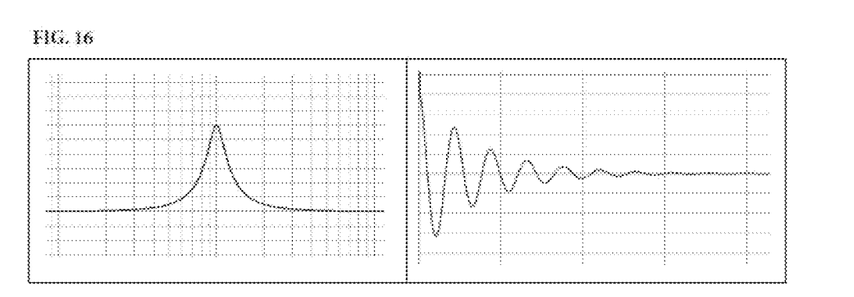
FIG. 16 shows the frequency and time response for a standard bell curve.
Figure 17:
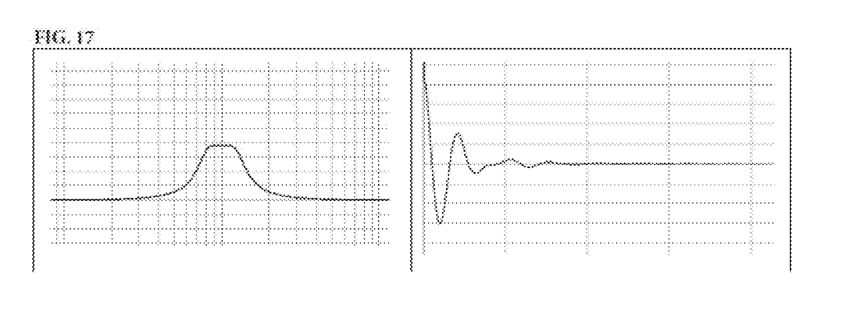
FIG. 17 shows the frequency and time response for a "Water" curve.
Figure 18:
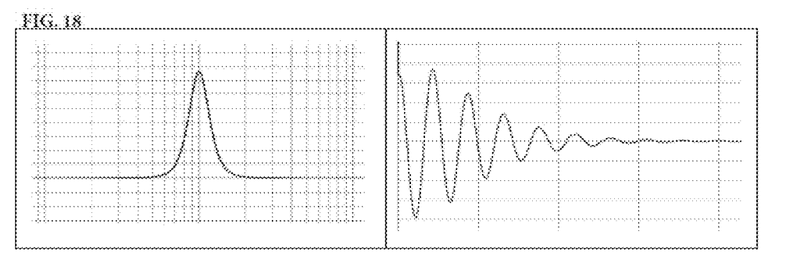
FIG. 18 shows the frequency and time response for a "Fire" curve.

FIGS. 16-21 show frequency and time responses for various standard, "Fire," and "Water" curves. FIG. 16 shows the frequency and time response for a standard curve with specific gain, frequency, and Q-factor settings. FIG. 17 shows the frequency and response times for a "Water" filtered curve with the same parameters as the Neutral curve in FIG. 16. Referring to FIGS. 16 and 17, the time is shorter, and the filter is less resonant in FIG. 17 than the peak in FIG. 16. The amplitudes of the two peaks shown in FIGS. 16 and 17 are the same at the beginning, but over time the amplitude of the "Water" filter decreases very quickly. FIG. 18 shows the frequency and time response for the "Fire" filtered curve of FIG. 16. Referring to FIGS. 16 and 18, the time is about the same length in FIG. 18 as shown in FIG. 16, so both curves are equally resonant. In these figures (FIGS. 16 and 18), the amplitude at the beginning of the response is approximately the same, but the amplitude decreases more slowly.

Figure 19:
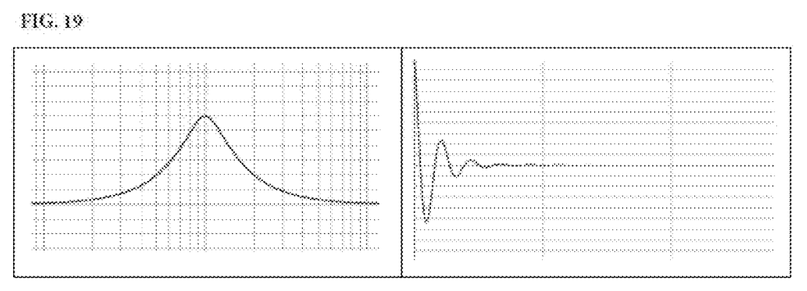
FIG. 19 shows the frequency and time response for a standard bell curve with a wide Q-factor.

FIG. 19 shows the frequency and time response for a standard bell curve with a wide Q-factor. In this curve, the time, or impulse response, is shown as short, and the amplitude at the beginning of the response is shown as high. In the figure, the amplitude and time decrease quickly, meaning the curve is not very resonant.

Figure 20:
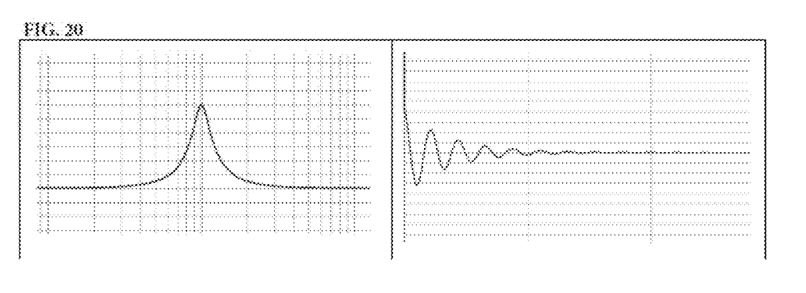
FIG. 20 shows the frequency and time response for a standard bell curve with a narrower Q-factor.

FIG. 20 shows the frequency and time response for a standard peak with a narrower Q-factor than shown in FIG. 19. The time is longer in FIG. 20 than in FIG. 19 and the amplitude of the curve in FIG. 20 at the beginning of the response is lower than the amplitude of FIG. 19. The filter shown in FIG. 20 is more resonant than the filter of FIG. 19 because the impulse response is longer.

Figure 21:
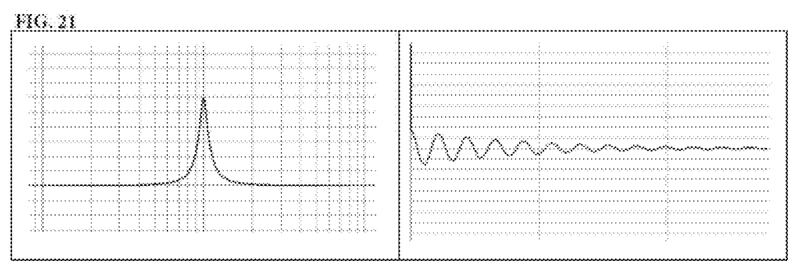
FIG. 21 shows the frequency and time response for a standard bell curve with a very narrow Q-factor.

FIG. 21 shows the frequency and time response for a standard curve with a very narrow Q-factor. In this figure, the time is long and the amplitude at the beginning of the response is low. The filter is very resonant because the time is long and the amplitude decreases slowly.

The disclosed embodiment may be a parametric equalization hardware that is coupled to computer readable memory software configured to present a command interface to a user and control the equalization hardware to manipulate the frequency, Q, and gain. Additionally, the software may be configured to simultaneously vary the Q and gain of an equalization curve between two preset values defined by: (1) a high gain and narrow Q ("Fire"); and (2) low gain and wide Q ("Water").

Figure 22:
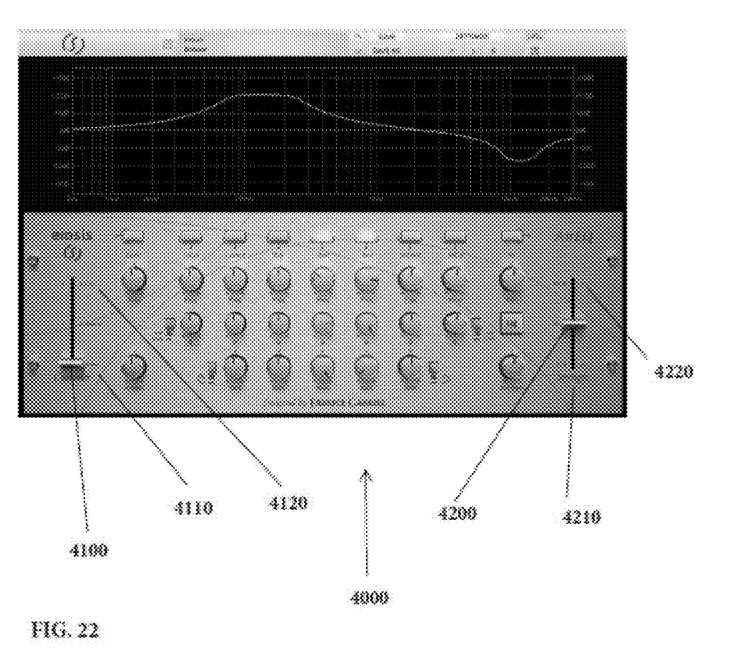
FIG. 22 shows the preferred embodiment of the instrument panel for the invention.

FIG. 22 depicts the instrument panel 4000 for the equalizer. There is a character control 4100 that controls the character of the curve. The Character Control 4100 is used to morph the different curves from one to each other, in order to provide a smooth transition from the "Water" curve 2000 to the "Neutral" curve 1000 (e.g., the transition shown in FIG. 5), and from the "Fire" curve 3000 to the "Neutral" curve 1000 (e.g., the transition shown in FIG. 11). Using the character slide 4100, a user can transition from "Water" 4110 to "Fire" 4120. On the other side of the instrument panel 4000 there is a strength slide 4200. The strength slide 4200 can adjust the strength of the equalization. The strength slide can go from low strength 4210 to high strength 4220.

The "Water" and "Fire" curves 2000, 3000 can be achieved by several equalization methods. One method is by the combination of several regular equalization curves. The parameter of the combined equalization regular curves can be calculated in several ways: by dichotomy; by calculating resulting curves; having absolute formulas; or by directly giving each parameter values.

The "Water" and "Fire" curves 2000, 3000 can also be processed using a finite impulse response (FIR) calculation. Using FIR calculation will result in the appropriate impulse response which will give the desired frequency response.

The curves 2000, 3000 can also be obtained using a Fast Fourier Transform (FFT) filter. The FFT filter will perform the filtering in the frequency domain. The audio will be transposed to the frequency domain by any method and the amplitude of each frequency will be modified to obtain the desired curve.

The "Water" and "Fire" curves 2000, 3000 can also be processed using several filtering techniques. The filters can be achieved with a combination of several classical infinite impulse response (IIR) curves. An IIR filter is a filter that uses outputs as input, resulting in an unending impulse response. Examples of IIR filters include, but are not limited to, Bell Shape filters, shelf filters, Low-Pass, High Pass, Butterworth filters, any kind of biquad filter, and a State Variable filter which uses a feedback structure.

In order to obtain the "Water" and "Fire" curves 2000, 3000 with a combination of Bell shaped, Shelf shaped, Low Pass or High Pass filters, each basic filter amplitude curve has to be measured with an FFT analyzer, or computed with the basic IIR coefficients. With the curve amplitude measurement, a combination of several curves can be designed to achieve the desired "Water" or "Fire" curve 2000, 3000.

An IIR filter type, which uses a feedback structure, can also be used and its coefficients computer to obtain the desired "Fire" and "Water" curves 3000, 2000. Computing the coefficients in order to achieve the desired "Water" or "Fire" 2000, 3000 curve can be done by the techniques known to those skilled in the art. The transition between "Water," "Neutral" and "Fire" curves 2000, 1000, 3000 can be made by varying the combined filter parameters. Changing the frequency, Q, and gain of each combined filter will change the resulting curve accordingly.

In summary what is disclosed includes: computer hardware with software installed on computer readable memory for producing a parametric bell equalization filter with the frequency, Q-Factor, and gain parameters with an additional parameter which controls resonances. In one embodiment, the additional parameter changes the shape of the bell shaped filter curve in real time continuously. In one mode, the additional parameter changes the shape of the peak filter by flattening the top peak of the curve, and keeping the sides of the curves close to the standard peak filter with the same parametric settings. Suitably, the additional mode has the specificity to have a shorter time response than a standard peak filter. In another mode, a filter is capable of making the sides of the curve have a lower gain than the standard filter and the center of the curve having a higher gain, wherein the shape is smoother than a standard filter, and wherein the filter has a time response approximately as long as the standard bell curve with the same frequency, Q-factor, and gain.

Other features will be understood with reference to the drawings. While various embodiments of the method and apparatus have been described above, it should be understood that they have been presented by way of example only, and not of limitation. Likewise, the various diagrams might depict an example of an architectural or other configuration for the disclosed method and apparatus, which is done to aid in understanding the features and functionality that might be included in the method and apparatus. The disclosed method and apparatus is not restricted to the illustrated example architectures or configurations, but the desired features might be implemented using a variety of alternative architectures and configurations. Indeed, it will be apparent to one of skill in the art how alternative functional, logical, or physical partitioning and configurations might be implemented to implement the desired features of the disclosed method and apparatus. Also, a multitude of different constituent module names other than those depicted herein might be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the method and apparatus is described above in terms of various exemplary embodiments and implementations, it should be understood that the various features, aspects, and functionality described in one or more of the individual embodiments are not limited in their applicability to the particular embodiment with which they are described, but instead might be applied, alone or in various combinations, to one or more of the other embodiments of the disclosed method and apparatus, whether or not such embodiments are described and whether or not such features are presented as being a part of a described embodiment. Thus the breadth and scope of the claimed invention should not be limited by any of the above-described embodiments.

Terms and phrases used in this document, and variations thereof, unless otherwise expressly stated, should be construed as open-ended as opposed to limiting. As examples of the foregoing: the term "including" should be read as meaning "including, without limitation" or the like, the term "example" is used to provide exemplary instances of the item in discussion, not an exhaustive or limiting list thereof, the terms "a" or "an" should be read as meaning "at least one," "one or more," or the like, and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that might be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases might be absent. The use of the term "module" does not imply that the components or functionality described or claimed as part of the module are all configured in a common package. Indeed, any or all of the various components of a module, whether control logic or other components, might be combined in a single package or separately maintained and might further be distributed across multiple locations.

Additionally, the various embodiments set forth herein are described in terms of exemplary block diagrams, flow charts, and other illustrations. As will become apparent to one of ordinary skill in the art after reading this document, the illustrated embodiments and their various alternatives might be implemented without confinement to the illustrated examples. For example, block diagrams and their accompanying description should not be construed as mandating a particular architecture or configuration.

The claims, as originally filed, are hereby incorporated into the specification by reference.

I claim:

1. An equalizer comprising:

parametric equalization hardware that is coupled to computer readable memory with software in the form of programming code configured to present a command interface to a user and control the equalization hardware to manipulate the frequency, the Q, and the gain of an audio signal;

wherein the computer hardware and software are configured to visually present the frequency response curve of the audio equipment to the user via the command interface;

wherein the computer software may be operationally configured to alter the shape of the resonance response curve and correspondingly equalize the audio signal;

wherein the software is further in the form of programming code that is configured to display a character control slider on the command interface that, when manipulated, simultaneously varies the Q and gain of an equalization curve between two preset values defined by: (1) a high gain and narrow Q; and (2) low win and wide Q.

2. An equalizer comprising:

audio equipment hardware, including an equalizer hardware and computer hardware coupled to computer readable memory;

software in the form of programming code installed on the computer readable memory for equalizing an audio signal and further in the form of programming code configured to present a command interface to a user and control the equalization hardware to manipulate the frequency, the Q, and the gain of an audio signal;

wherein the computer hardware and software are configured to visually present the frequency response curve of the audio equipment to the user;

wherein the computer software is operationally configured to alter the shape of the resonance response curve and correspondingly equalize the audio signal;

wherein, the frequency response is presented as a normal bell curve, wherein the software is configured for adjusting the curve via manipulating the frequency for translating the curve, Q for manipulating the horizontal scale of the curve, and gain for adjusting the vertical scale of the curve; and, wherein the software is further in the form of programming code that is configured to display a character control slider that, when manipulated, simultaneously varies the Q and gain of an equalization curve between two preset values defined by: (1) a high gain and narrow Q; and (2) low gain and wide Q.

* * * * *